United States Patent
Gammel et al.

(10) Patent No.: US 8,378,318 B1
(45) Date of Patent: Feb. 19, 2013

(54) FIXED MASK DESIGN IMPROVEMENTS

(75) Inventors: George Gammel, Marblehead, MA (US); Benjamin Riordon, Newburyport, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 13/299,682

(22) Filed: Nov. 18, 2011

(51) Int. Cl.
*H01J 37/317* (2006.01)
*H01J 37/30* (2006.01)
*G01K 1/02* (2006.01)

(52) U.S. Cl. ............ 250/492.21; 250/492.2; 250/492.3; 250/397; 250/398; 438/514

(58) Field of Classification Search ............ 250/492.21, 250/492.3, 397, 398; 438/514
See application file for complete search history.

(56) References Cited

U.S. PATENT DOCUMENTS

| | | | |
|---|---|---|---|
| 6,335,534 B1 | 1/2002 | Suguro et al. | |
| 6,403,972 B1 * | 6/2002 | Cucchetti et al. | 250/492.21 |
| 6,989,545 B1 * | 1/2006 | Rathmell et al. | 250/492.21 |
| 7,394,073 B2 * | 7/2008 | Cummings et al. | 250/397 |
| 8,216,923 B2 * | 7/2012 | Bateman et al. | 438/514 |
| 2010/0059362 A1 | 3/2010 | Anella | |
| 2011/0031408 A1 | 2/2011 | Riordon et al. | |

* cited by examiner

*Primary Examiner* — Nikita Wells

(57) ABSTRACT

A mask or set of masks is disclosed in which outward projections are placed on either side of at least one aperture. An ion beam is then directed through the mask toward a workpiece. An ion collecting device or an optical system is then used to measure the alignment of the mask to the ion beam. These projections serve to increase the sensitivity of the system to misalignment. In another embodiment, a blocker is used to create a region of the workpiece that is not subjected to a blanket implant. This facilitates the use of optical means to insure and determine alignment of the mask to the ion beam.

20 Claims, 14 Drawing Sheets

FIXED MASK DESIGN IMPROVEMENTS

FIELD

This invention relates to implanting solar cell substrates, and, more particularly, to insuring alignment of a mask to a solar cell substrate.

BACKGROUND

Ion implantation is a standard technique for introducing conductivity-altering impurities into semiconductor substrates. A desired impurity material is ionized in an ion source, the ions are accelerated to form an ion beam of prescribed energy, and the ion beam is directed at the surface of the substrate. The energetic ions in the beam penetrate into the bulk of the semiconductor material and are embedded into the crystalline lattice of the semiconductor material to form a region of desired conductivity.

Solar cells are only one example of a device that uses silicon substrates, but these solar cells are becoming more important globally. Any reduced cost to the manufacturing or production of high-performance solar cells or any efficiency improvement to high-performance solar cells would have a positive impact on the implementation of solar cells worldwide. This will enable the wider availability of this clean energy technology.

Solar cell efficiency may be improved by, for example, doping the regions under metal lines more than between lines as this reduces contact resistance. This can be done with masks, which may either move with the wafer, or be fixed. The first may reduce throughput significantly or increase complexity, so the latter may be preferable. However, one issue associated with the use of fixed masks is the ability to insure and measure the alignment of the mask with the workpiece. Often, alignment verification techniques are cumbersome and time consuming. Therefore, it would be beneficial if there were a system and method to reduce the time required to insure alignment of masks, particularly for use in the creation of solar cells.

SUMMARY

A mask or set of masks is disclosed in which outward projections are placed on either side of at least one aperture. An ion beam is then directed through the mask toward a workpiece. An ion collecting device or an optical system is then used to measure the alignment of the mask to the ion beam. These projections serve to increase the sensitivity of the system to misalignment. In another embodiment, a blocker is used to create a region of the workpiece that is not subjected to a blanket implant. This facilitates the use of optical means to insure and determine alignment of the mask to the ion beam.

BRIEF DESCRIPTION OF THE DRAWINGS

For a better understanding of the present disclosure, reference is made to the accompanying drawings, which are incorporated herein by reference and in which.

DETAILED DESCRIPTION

The embodiments of the apparatus and process described herein may be performed by, for example, a beam-line ion implanter. Other plasma processing equipment or equipment that generates ions also may be used. While a silicon solar cell is specifically disclosed, other solar cell substrate materials also may benefit from embodiments of the process described herein. Furthermore, while a solar cell is discussed, this process also may be applied to semiconductor wafer fabrication or other substrates.

Figure 1:
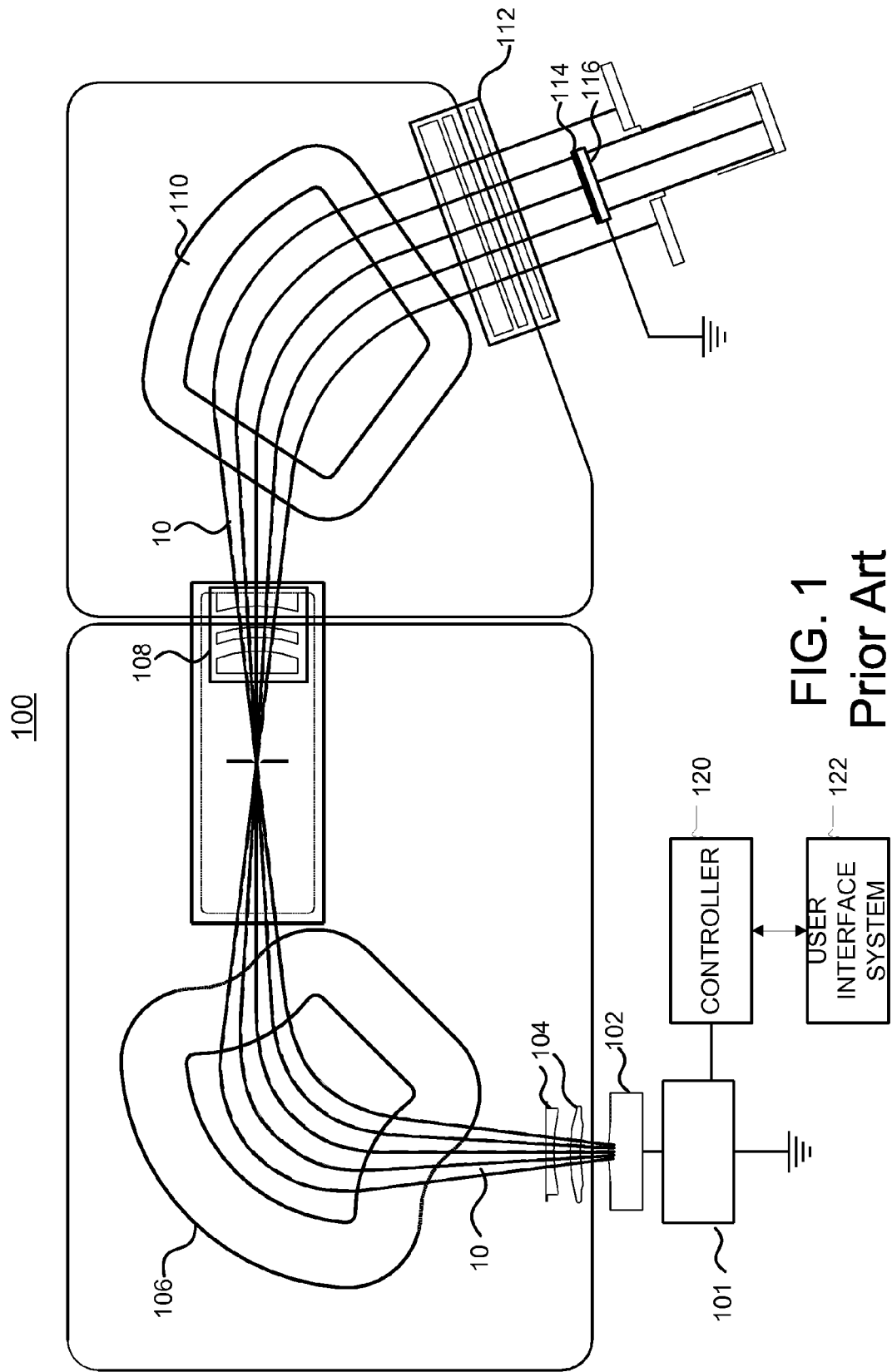
FIG. 1 is a block diagram of a beam-line ion implanter.

Turning to FIG. 1, a block diagram of a beam-line ion implanter 100 is illustrated. Those skilled in the art will recognize that the beam-line ion implanter 100 is only one of many examples of beam-line ion implanters that can provide ions for doping a selected material. Thus, this disclosure is not limited solely to the beam-line ion implanter 100 of FIG. 1.

The conventional ion implanter may comprise an ion source 102 that may be biased by a power supply 101. The system may be controlled by controller 120. The operator communicates with the controller 120 via user interface system 122. The ion source 102 is typically contained in a vacuum chamber known as a source housing (not shown). The ion implanter system 100 may also comprise a series of beam-line components through which ions 10 pass. The series of beam-line components may include, for example, extraction electrodes 104, a 90° magnet analyzer 106, a first deceleration (D1) stage 108, a 70° magnet collimator 110, and a second deceleration (D2) stage 112. Much like a series of optical lenses that manipulate a light beam, the beam-line components can manipulate and focus the ion beam 10 before steering it towards a workpiece or wafer 114, which is disposed on a workpiece support 116.

In operation, a workpiece handling robot (not shown) disposes the workpiece 114 on the workpiece support 116 that moves the wafer through the beam. Meanwhile, ions are generated in the ion source 102 and extracted by the extraction electrodes 104. The extracted ions 10 travel in a beam-like state along the beam-line components and implanted on the workpiece 114. After implanting ions is completed, the workpiece handling robot may remove the workpiece 114 from the workpiece support 116 and from the ion implanter 100.

Figure 2:
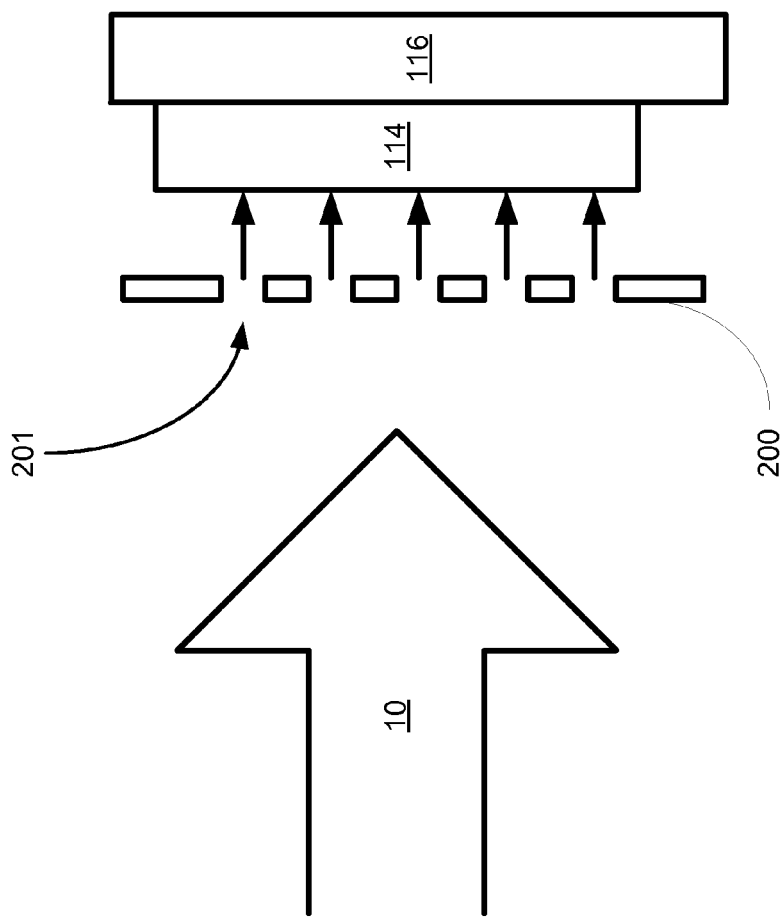
FIG. 2 is a diagram showing the use of a mask during ion implantation.

In some embodiments, as shown in FIG. 2, a mask 200 may be used to block a portion of the ion beam 10 from striking a portion of the workpiece 114. The mask 200 may be located near the workpiece 114, preferably with some gap between it and the workpiece 114. The mask 200 has apertures 201 that allow ions to pass through portions of the mask 200, while blocking ions 10 in other portions. Such a mask 200 allows for the selective implantation of ions into the workpiece 114.

The ion implanter may include additional components known to those skilled in the art. For example, the end station also may include a dose measuring system, an electron flood gun, or other known components. It will be understood to those skilled in the art that the entire path traversed by the ion beam is evacuated during ion implantation. The beam-line ion implanter 100 may incorporate hot or cold implantation of ions in some embodiments.

Use of the mask 200 may eliminate certain process steps, such as silkscreening or lithography, which are needed for other ion implantation techniques. However, it may be difficult to properly align the mask 200 relative to the workpiece 114 such that the desired pattern is implanted. The mask 200, the ion beam 10, and the workpiece support 116 all have linear and angular tolerance variations that may lead to misalignment or misplacement of the mask 200.

Figure 3:
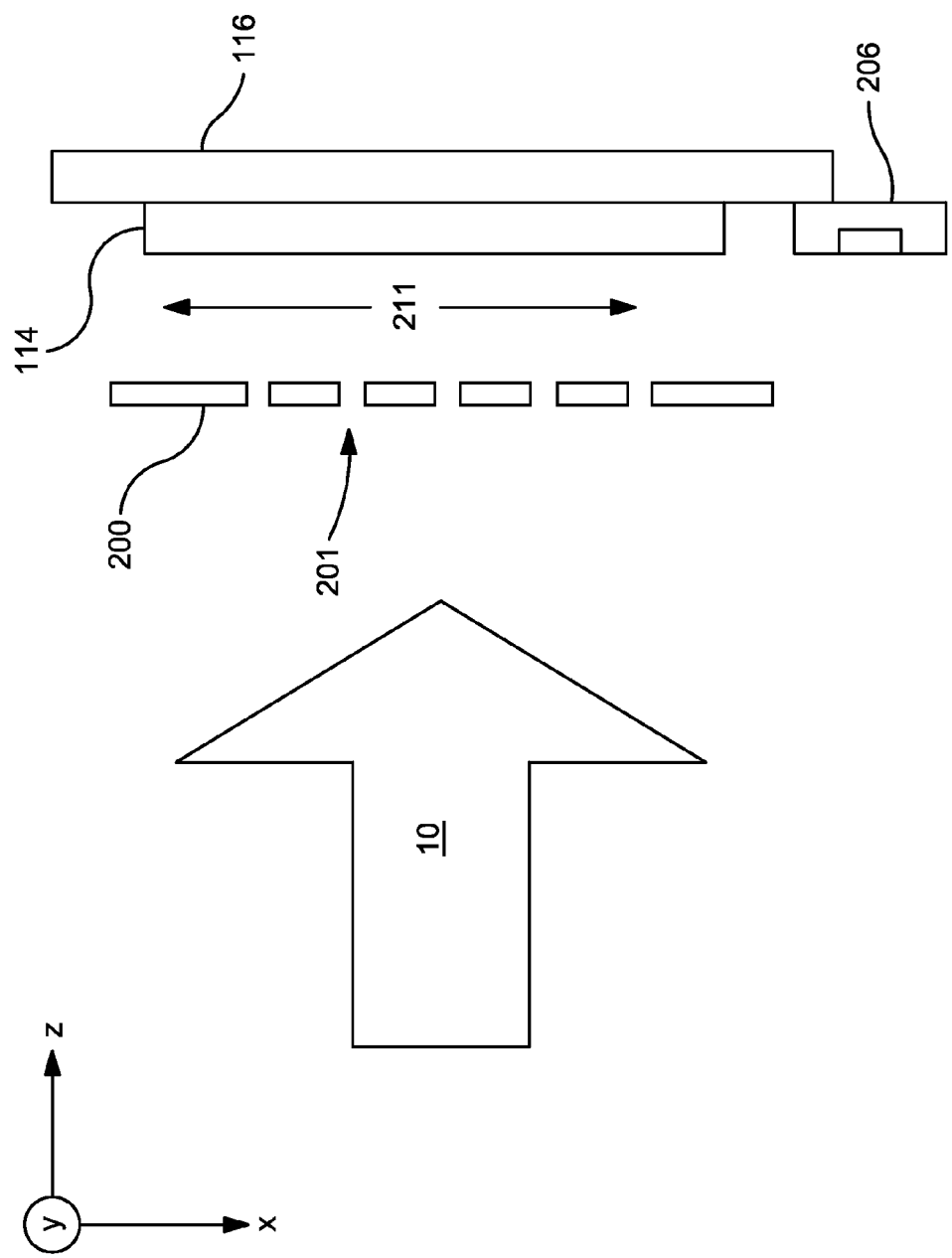
FIG. 3 is a diagram showing the use of a Faraday probe to insure alignment of a mask.

The mask 200 is preferably perpendicular to the beam, and the workpiece 114 must be aligned with respect to the mask 200. FIG. 3 shows one method that can be used to insure the mask is perpendicular to the beam. This figure is a side view showing a mask 200, which includes a Faraday probe 206 positioned such that the Faraday probe 206 and the workpiece 114 are coplanar. The mask 200 includes a plurality of apertures 201 and is disposed in front of the workpiece 114. The apertures 201 may also be configured as holes, slots or other geometry configured to allow portions of the ion beam 10 through the mask. The mask 200 may be translated or positioned in multiple axes using a translation mechanism (not shown). This translation mechanism may be a servo motor used to variably position the mask linearly with respect to a distance from workpiece 114 and angularly with respect to the transmission of ion beam in the z direction through the apertures 201. The workpiece 114 may be scanned behind the mask 200 in one embodiment to obtain a uniform pattern of implanted regions. The implanted regions may resemble "stripes" across the surface of the workpiece 114 in the X and Y directions. For proper operation, the mask 200 must be aligned (as described below) with workpiece 114 as well as the ion beam 10 implanted through the apertures 201.

The Faraday probe 206 is configured to move in the X direction across the ion beam 10. The Faraday probe 206 is positioned on the same plane (i.e. the XY plane) as the surface of workpiece 114. The Faraday probe 106, or Faraday cup, is used to measure the current of ion beam 10 incident thereon.

The controller then reads the control signal from the ion collecting device, such as the Faraday probe 206, and determines if position correction is necessary for the mask 200 or ion beam 10. The controller can send signals to the translation mechanism, or another system or component to correct positioning of the mask. In one embodiment, a separate motion control system may be used to process the new desired positioning requirements and to drive the various mechanisms, systems, and components. The controller also may adjust the ion beam 10 or workpiece support 116. Use of the Faraday probe 206 enables more accurate placement or positioning of the mask 200, workpiece 114, and ion beam 10 and improves implantation of the workpiece 114 by optimally aligning the apertures 201 of mask 200 with the beam 10.

Figure 4:
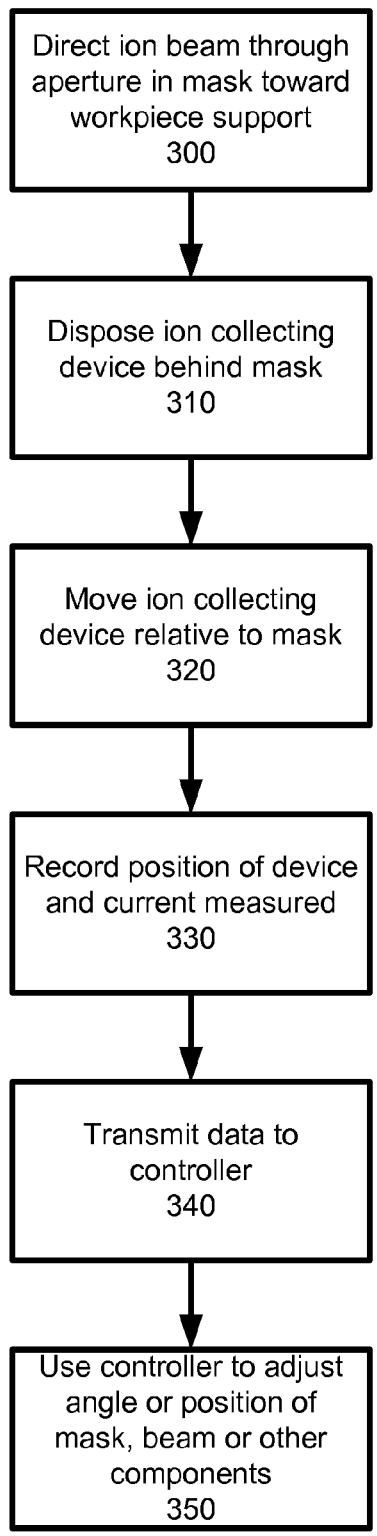
FIG. 4 is a flowchart describing an alignment procedure.

Thus, the mask may be aligned by following the steps shown in FIG. 4. First, an ion beam 10 is directed through an aperture in a mask toward a workpiece support 116, as shown in step 300. An ion collecting device, such as a Faraday probe 206 is disposed behind the mask, coplanar with the surface of the workpiece 114, as shown in step 310. The ion collecting device is then moved relative to the mask 200 so as to measure the ion current in various locations between the mask 200 and the workpiece 114, as shown in step 320. The position of the ion collecting device is recorded, and along with that position, the current measured at that position is recorded, as shown in step 330. This information can then be transmitted to a controller, in step 340. The controller then interprets the data and makes adjustments to the position or angle of the mask, ion beam or other component as appropriate, as shown in step 350.

Figure 5:
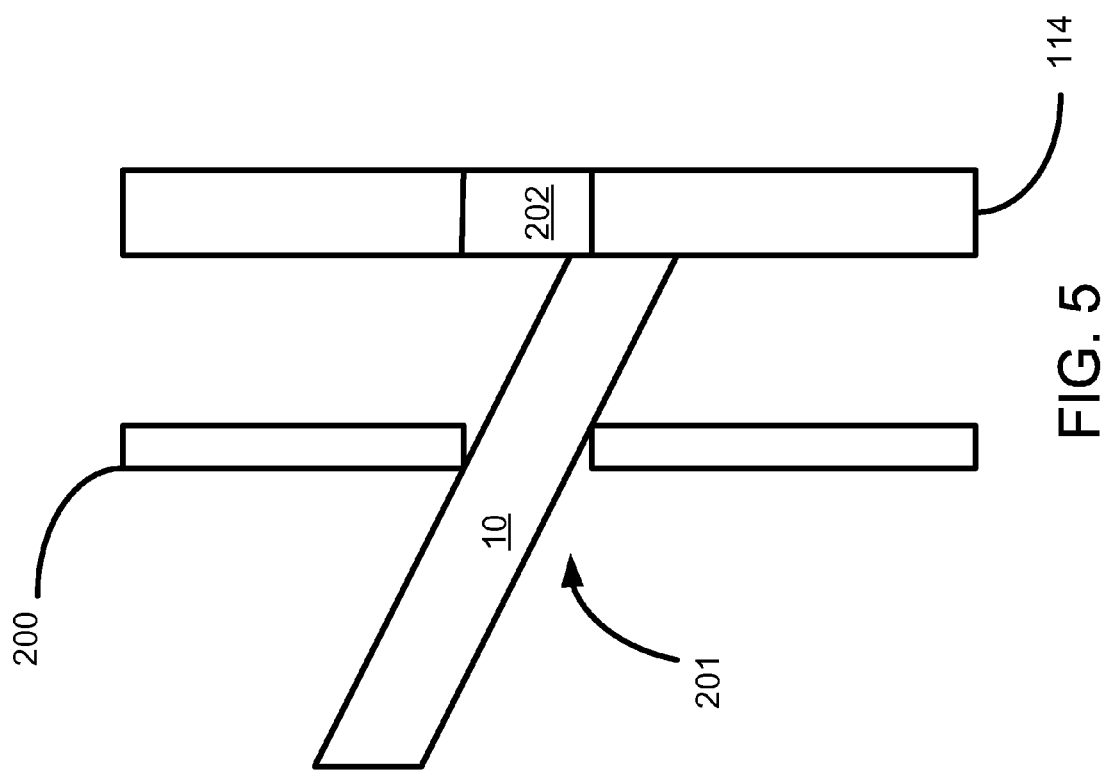
FIG. 5 shows a gross misalignment of an ion beam and a mask.

FIG. 5 shows the effect of large misalignment between the ion beam 10, the mask 200 and the workpiece 114. In this scenario, region 202 denotes the area of the workpiece 114 that is intended to be implanted. Due to the misalignment of the ion beam 10 and the mask 200, most of the ion beam strikes the workpiece 114 in regions other than region 202. If the Faraday probe 206 is positioned in the space denote by region 202, it would detect a decrease in the current due to this misalignment, as expected.

Figure 6:
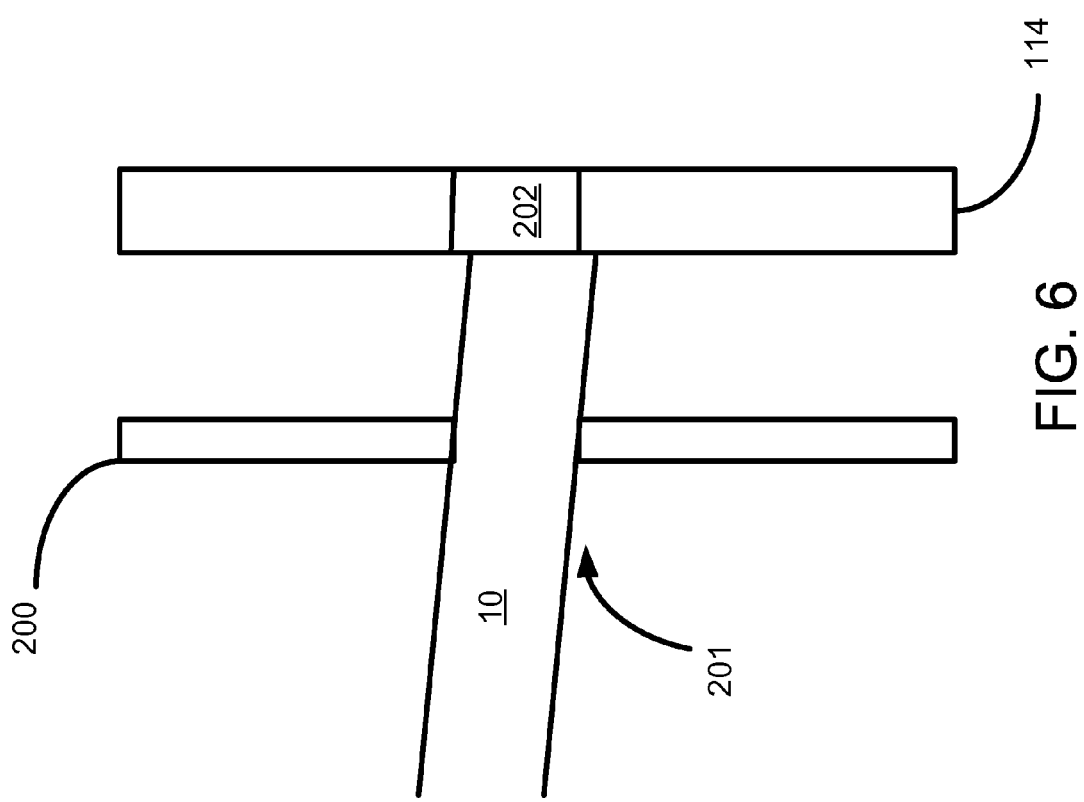
FIG. 6 shows a slight misalignment of an ion beam and a mask.

FIG. 6 shows the effect of a slight misalignment between the ion beam, the mask 200 and the workpiece 114. As shown in FIG. 5, the region 202 denotes the area of the workpiece 114 that is intended to be implanted. However, since the misalignment is much smaller in this scenario, the majority of the ion beam still strikes the intended region 202. Thus, a Faraday probe 206 may not detect an appreciable variation in the current when the misalignment between the ion beam 10 and the mask 200 is slight.

Figure 7:
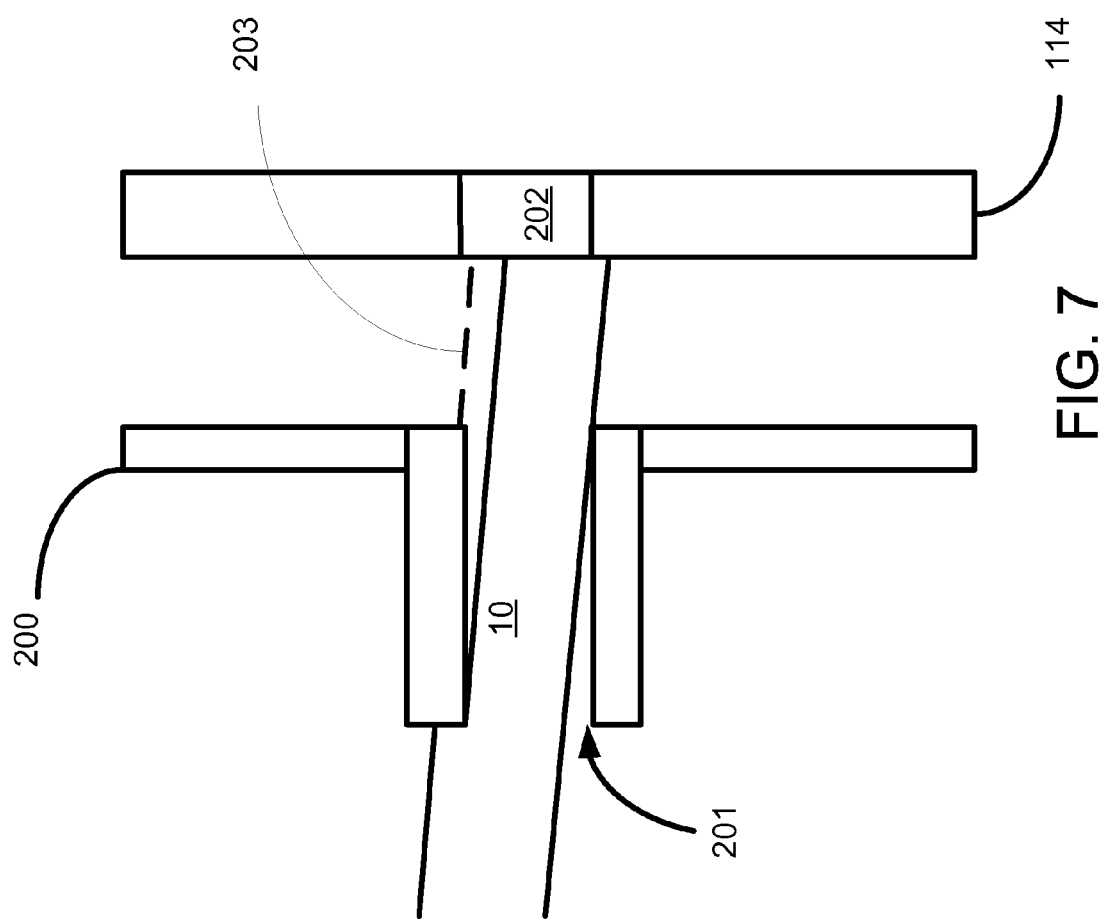
FIG. 7 shows the effect of increased mask thickness near the aperture.

There are several factors that influence the amount of variation in current that results from a misalignment. One factor is the angle of misalignment, where the angle of misalignment is defined as the offset from perpendicular between the ion beam 10 and the mask 200. Larger angles of misalignment will result in greater current variation, as demonstrated by FIGS. 5 and 6. A second factor is the distance between the mask 200 and the workpiece 114. The greater the gap between these components, the more variation in current. However, often this parameter cannot be easily modified. A third factor is the ratio of the width of the aperture 201 as compared to the thickness of the mask 200. FIG. 7 shows the scenario of FIG. 6, where the thickness of the mask 200 on both sides of the aperture 201 has been increased. Due to this localized increase in thickness, the amount of ion beam 10 that is able to pass through the aperture 201 is reduced. For comparison, line 203 shows the path of the ion beam if the thickness of the mask 200 had not been increased. Thus, the sensitivity of a Faraday probe 206 may be increased by increasing the ratio of the thickness of the mask 200 to the width of the aperture 201. While in FIG. 7, the thickness is increased by adding extensions which extend toward the ion beam, the disclosure is not limited to this embodiment. For example, if there is sufficient space, the extensions may extend toward the workpiece 114. In other words, the mask must be increased in the dimension parallel to the path of the ion beam, however, the method used to accomplish this may vary.

Figure 8:
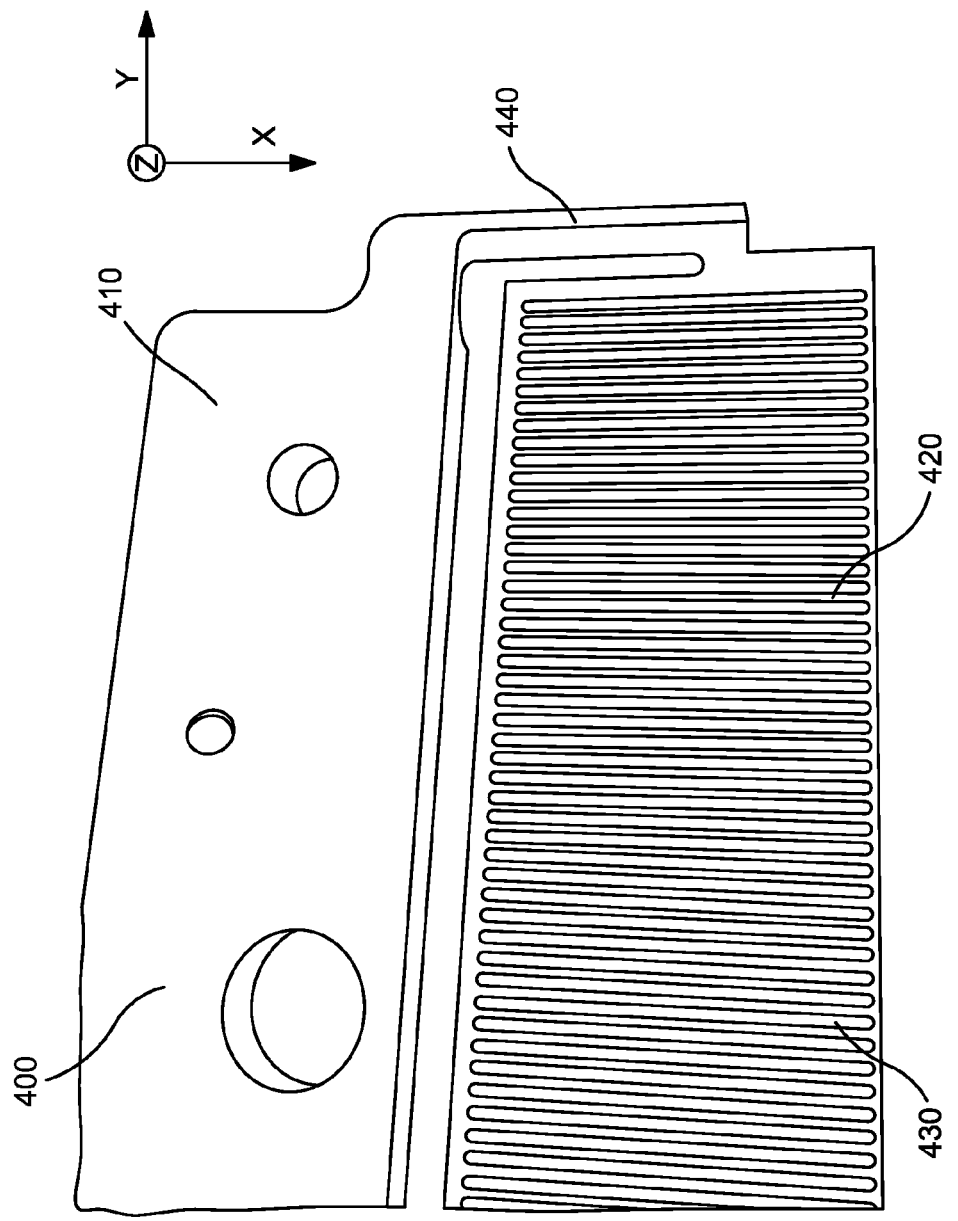
FIG. 8 shows an enlarged view of the right side of a mask.

FIG. 8 shows an enlarged view of a first side of a mask 400. In this mask 400, there is an upper support 410 and a lower mask region 420. The mask region 420 contains a plurality of apertures 430. In this particular embodiment, the apertures 430 are vertical stripes, suitable for implanting a solar cell. As used in this disclosure, a vertical stripe is an aperture that is longer in the X dimension than in the Y dimension. The smaller ends of the stripe may be straight or rounded. In some embodiments, the length of the vertical stripe (in the X dimension) may be less than the length of the workpiece 114.

However, other shapes and orientations of apertures are also within the scope of the disclosure. A first attachment arm 440 is used to couple the upper support 410 to the mask region 420. Although not required, in this embodiment, the first attachment arm 440 is raised above the plane of the mask 400. In other words, upper support 410 and mask region 420 lie in a common plane. The first attachment arm 440 begins in that plane at the point where it attaches to the upper support 410. The first attachment arm 440 then extends in the direction toward the source of the incoming ion beam (i.e. Z direction), which is no longer coplanar with the rest of the mask 400. The first attachment arm 440 then returns to that plane, where it attaches to the mask region 420.

Figure 9:
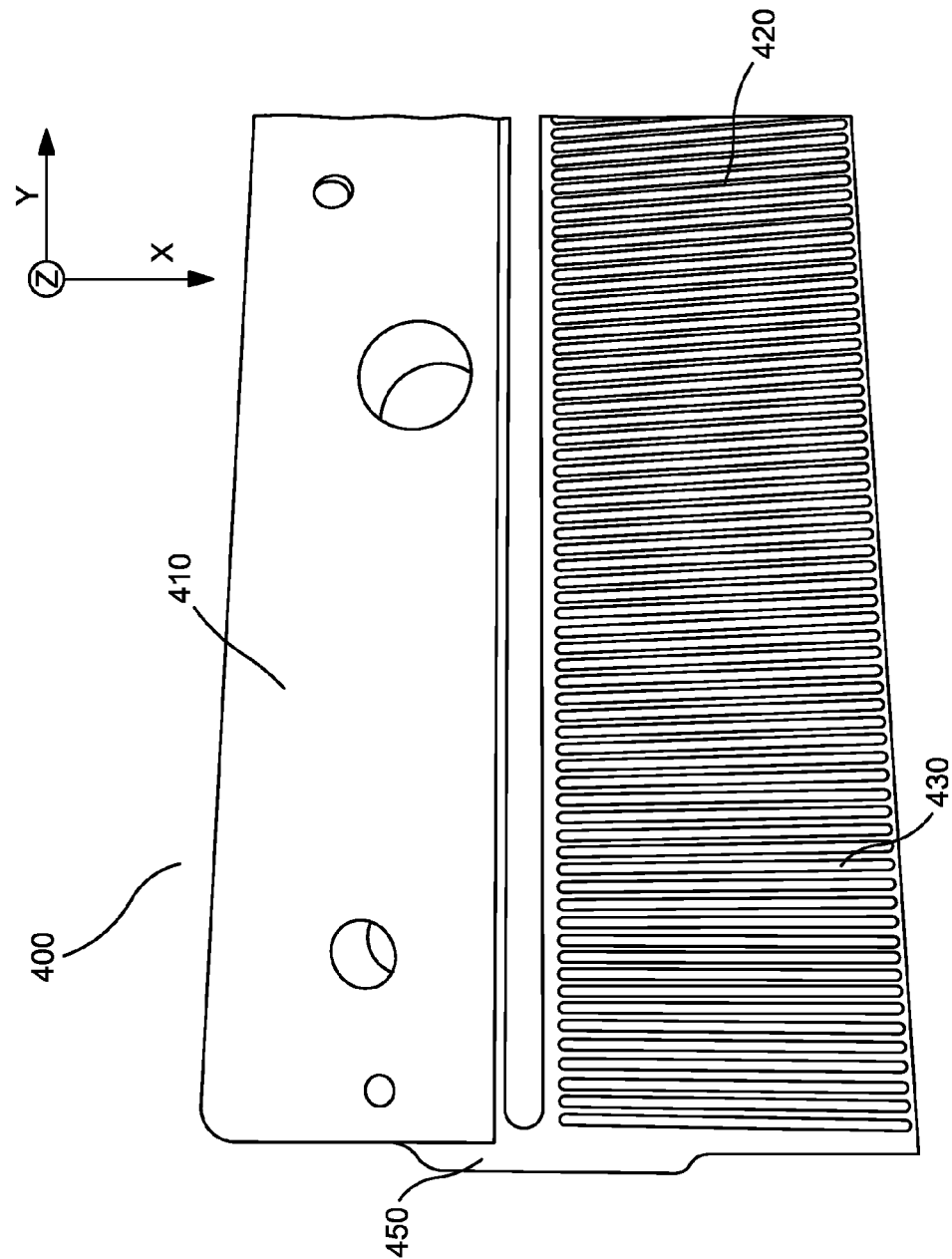
FIG. 9 shows an enlarged view of the left side of the mask of FIG. 8.

FIG. 9 shows an enlarged view of the second side of mask 400. Upper support 410 is attached to mask region 420 via a second attachment arm 450. Unlike first attachment arm 440, the second attachment arm 450 is in the same plane as the rest of the mask 400. The second attachment arm 450 extends outward in the Y direction and attaches to the mask region 420.

In some embodiments, two or more of these masks 400*a*, 400*b* may be placed adjacent to one another to form an extended mask, as illustrated in other FIGs. For example, in some embodiments, multiple workpieces may be processed simultaneously, such as in an array. One such array may have 6 workpieces, where the workpieces are arranged as two adjacent columns, each having three workpieces.

Figure 10:
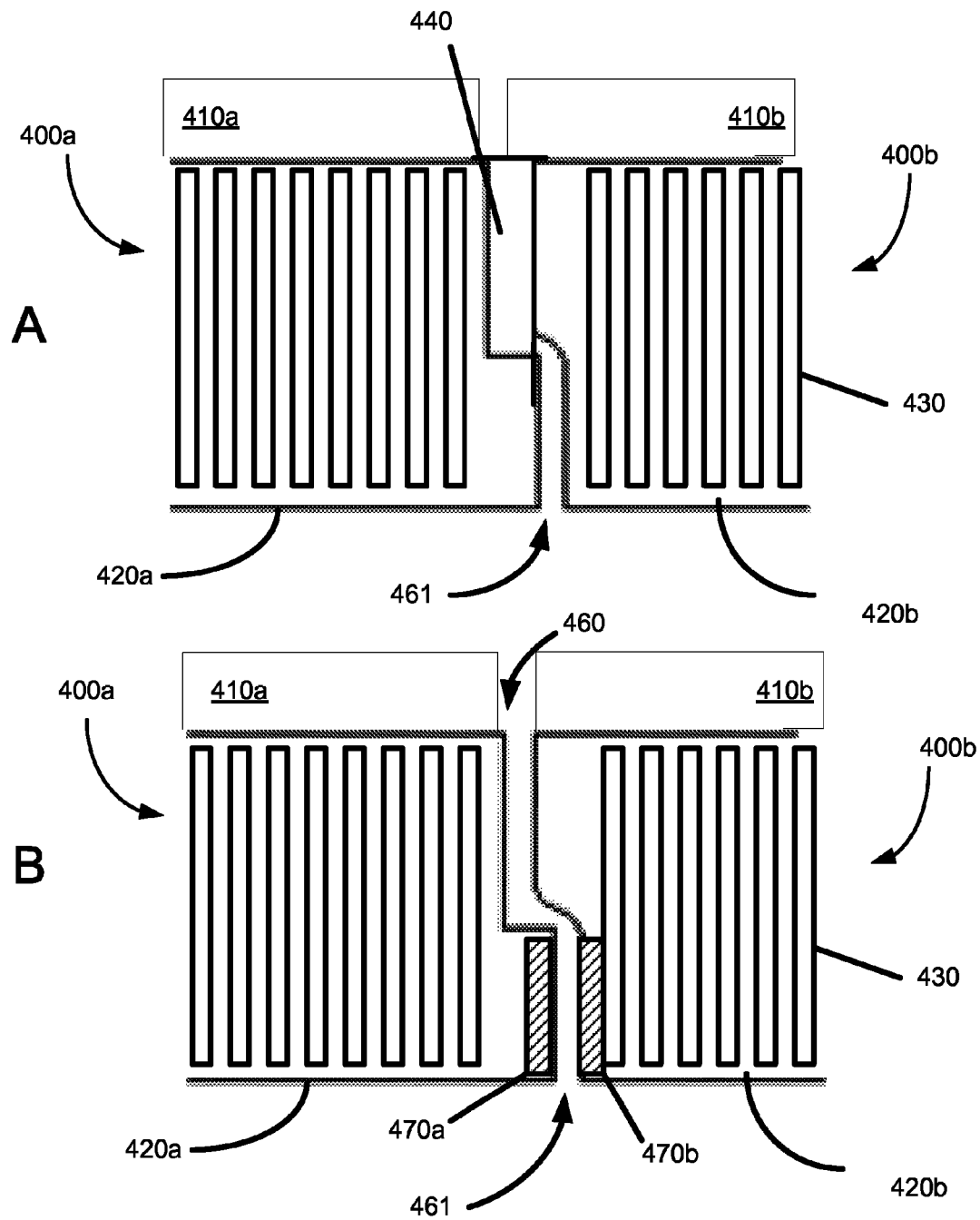
FIG. 10A shows a front view of a combination mask using two masks of FIGS. 8 and 9.
FIG. 10B shows the combination mask of FIG. 10A with the right attachment arm removed and added projections.

FIG. 10A shows a simplified front view of mask 480, which is made up of first and second masks 400*a*, 400*b*, and is designed to illustrate how the masks are positioned relative to each other. As can be seen, there are apertures 430 on mask regions 420*a*, 420*b*. However, where the first and second masks 400*a*, 400*b* come together, there is a region where there are no apertures. This may be the space between the two workpieces in the array described above. In fact, this gap between first and second masks 400*a*, 400*b* is partially obscured by first attachment arm 440. Only lower gap 461 can be seen when the first and second masks 400*a*, 400*b* are arranged as shown in FIG. 10A. In FIG. 10B, the first mask 400*a* has been modified to remove the first attachment arm 440, so as to show the in-plane view of the first and second masks 400 and the entire gap 460 between the two masks.

Lower gap 461 may be used to create the alignment aperture that may be used as described above in reference to FIG. 4. To increase the sensitivity of this gap to alignment errors, outward projections 470*a*, 470*b*, are included on first and second masks 400*a*, 400*b*, respectively. These projections extend in the Z direction, so as to increase the ratio of the mask thickness to the aperture width, as described earlier. In the absence of these projections, this ratio may be about 0.5:1. In some embodiments, the extent of the projections is such so as to create a ratio greater than or equal to 5:1, and preferably 10:1, thereby increasing the accuracy of the alignment process.

While the above describes a configuration where two masks are placed in close proximity, and one of the projections is placed on each of the masks, the disclosure is not so limited. For example, a single mask can be used, where the projections are placed on opposite sides of a single aperture. In another embodiment, multiple masks are used, but both of the projections are located on a single mask. If more than two masks are employed, the projections may be introduced on either side of each gap 461.

By incorporating these projections 470 onto the mask 400, increased sensitivity to ion beam misalignment is achieved. This misalignment can be detected as described above using an ion collecting device, or may be detected using other methods. For example, an optical sensor may be used to determine the locations of the implanted regions on a processed workpiece. For example, in some embodiments, the workpiece is implanted with ions through the combination mask shown in FIGS. 10A-B. After processing and annealing in an oxygen or nitrogen atmosphere, an optical scanner can be used to observe the implanted regions on the workpiece. The position, width, and other visible characteristics of the implanted region can then be compared to acceptable limits. Any unacceptable variations from those limits can then be flagged as failures, requiring alignment of the ion beam, mask or other component.

Figure 11A:
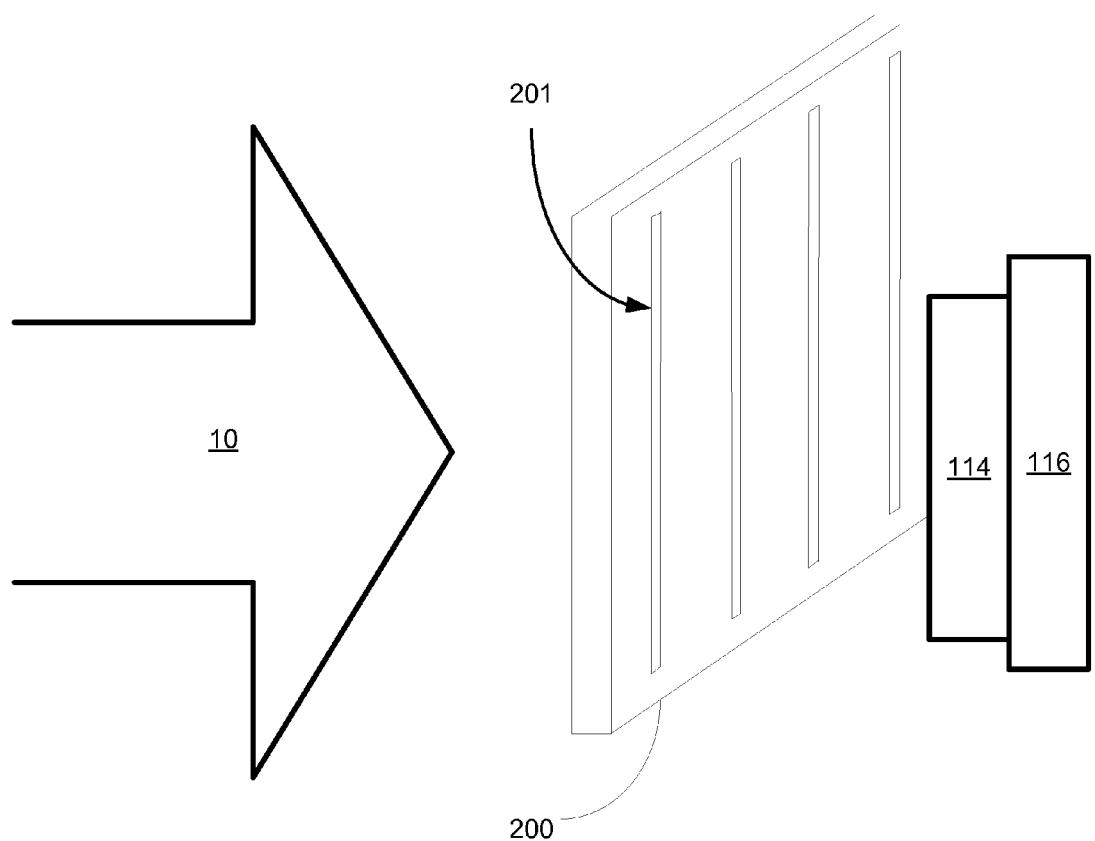
FIG. 11A shows the position of the mask, workpiece and ion beam during selective implants.
Figure 11B:
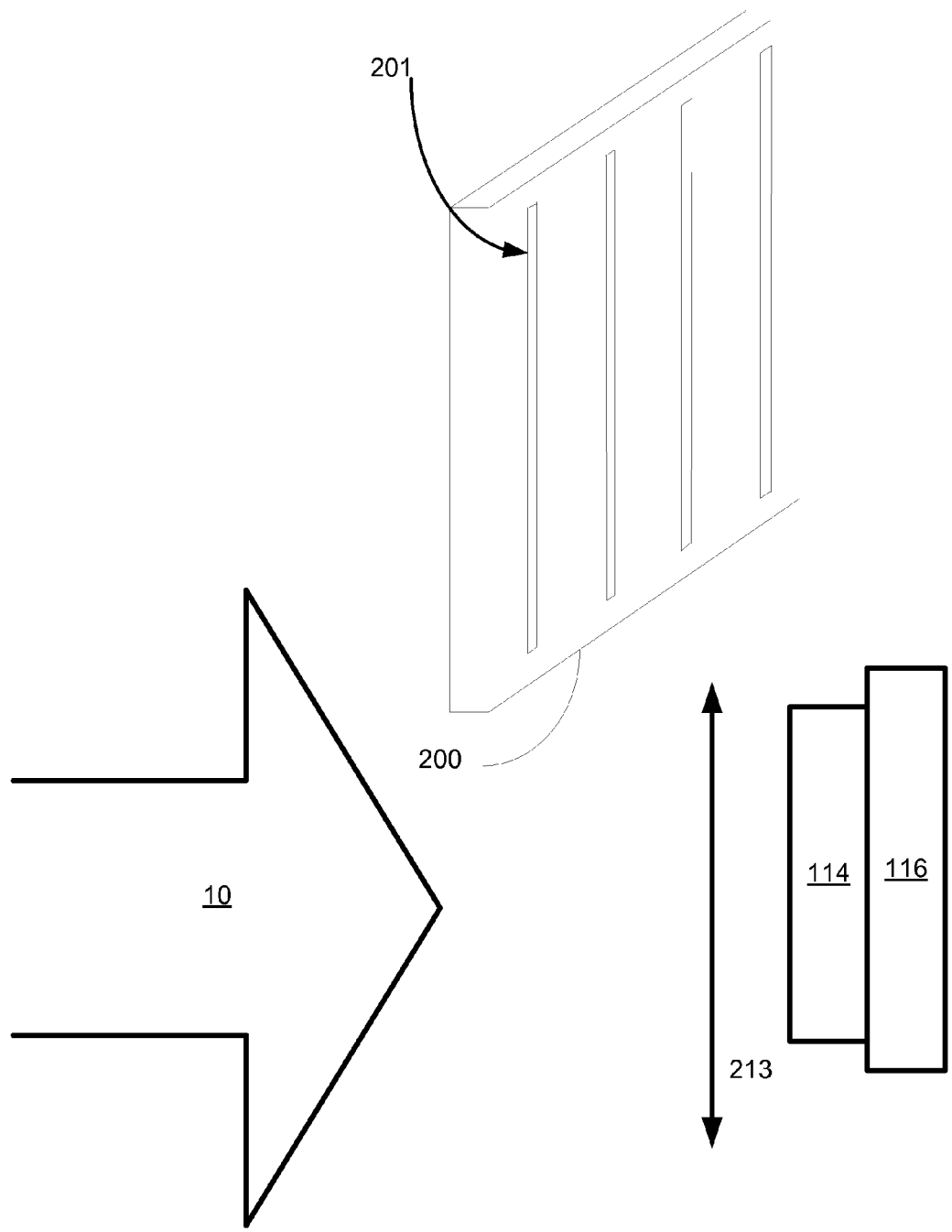
FIG. 11B shows the position of the mask, workpiece and ion beam during a blanket implant.

In other embodiments, a solar cell is made by exposing the workpiece 114 to a blanket implant, where the entire surface is exposed to the ion beam, and patterned implanted, such as through the mask. One way of performing this type of sequential implant is shown in FIGS. 11A-B. FIG. 11A shows the workpiece located on the opposite side of the mask 200 as the ion source, such that a selective implant may be performed. In FIG. 11B, the mask 200 and the workpiece have been moved relative to each other in the X direction, as shown by arrow 213, such that the workpiece is below the mask, and fully exposed to the ion beam 10. In some embodiments, the mask 200 is moved relative to the workpiece. In other embodiments, the workpiece 114 is moved relative to the mask 200. When positioned as shown in FIG. 11A, a patterned implant is performed, while a blanket implant is performed when the workpiece is positioned as shown in FIG. 11B. In some embodiments, the workpiece 114 and workpiece support 116 are continuously moved up and down, such that the implant sequence is a series of patterned implants, followed by blanket implants. In some instances, the patterned and blanket implants may be performed at least partially simultaneously.

While the above description describes the mask and workpiece moving vertically with respect to each other, the disclosure is not limited to this embodiment. For example, the mask and workpiece may be placed side by side, such that they move horizontally relative to each other.

While this implant sequence is effective in creating a solar cell, the optical scanning technique described above requires an anneal in an oxygen or nitrogen atmosphere to make the implanted stripes visible. The blanket portion of the implant performed in FIG. 11B tends to obscure or erase the visible implanted regions created during the patterned implant of FIG. 11A. As a result, it is necessary to have to grow an oxide or nitride layer to observe the selectively implanted regions. This may increase the number of process steps and prevents the ability to provide immediate feedback regarding alignment.

Figure 12:
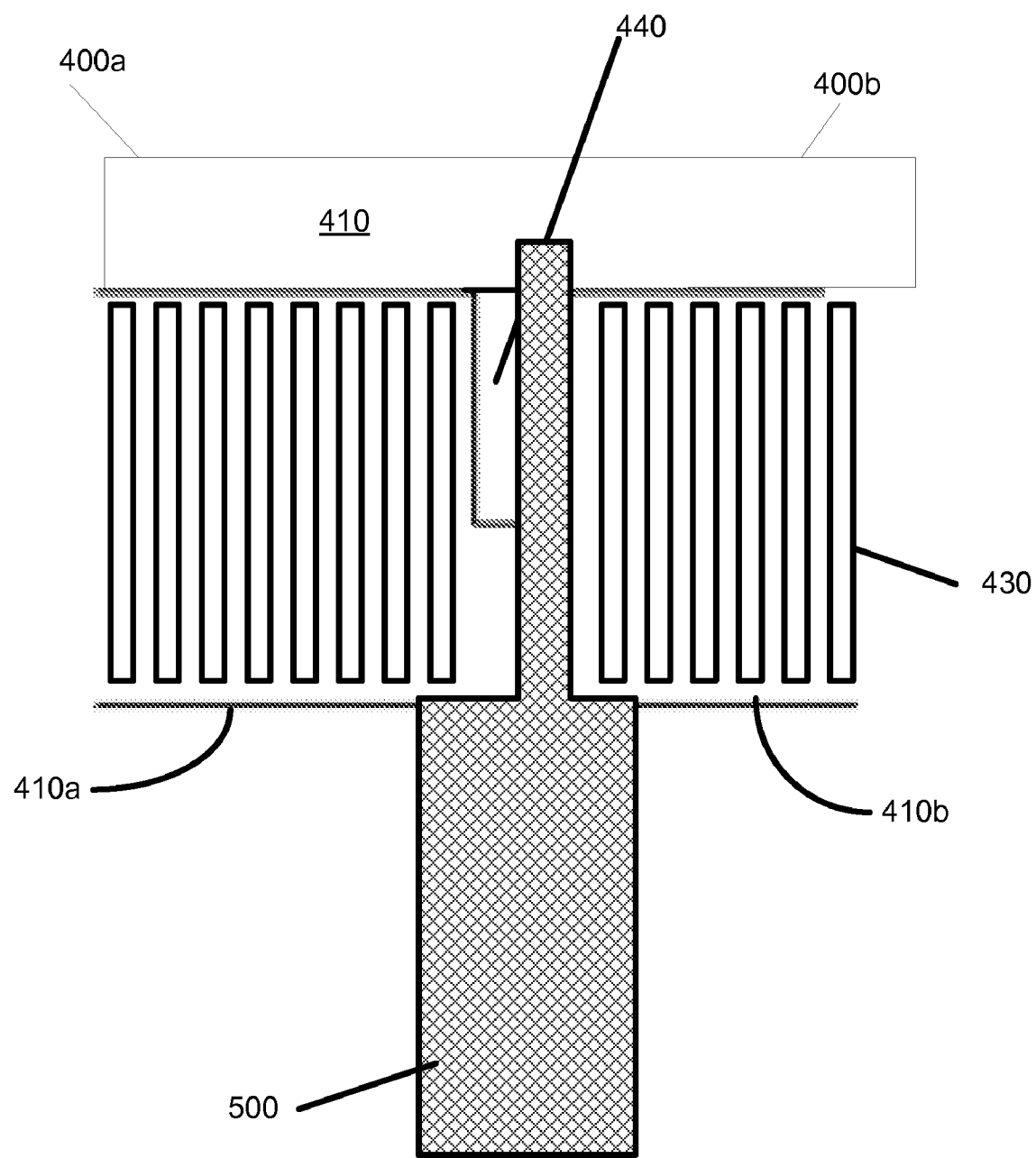
FIG. 12 shows a blocking device.

Thus, a system whereby the visible evidence of the pattern implant is not obscured by a blanket implant would be beneficial. FIG. 12 shows a blocker 500, which may be attached to the upper support 410*a* or 410*b* of the mask. This blocker 500 may be attached by adding one or more tapped holes in the upper supports 410*a* and 410*b*. This blocker 500 may be made of any suitable material, such as graphite, that blocks the passages of ions. The blocker 500 is configured so as to extend beyond the rightmost aperture on the left mask 400*a* and the leftmost aperture on the right mask 400*b*. In this way, the striped regions that correspond to these two apertures are never exposed to a blanket implant. Thus, these two stripes are readily visible after the workpiece has been processed. These two stripes can then be analyzed using an optical scanner. The optical scanner can search for features on the surface and then determine the position of these features with respect to some reference point, such as the edge of the wafer to a high degree of accuracy, such as +/−10 um.

Figure 13:
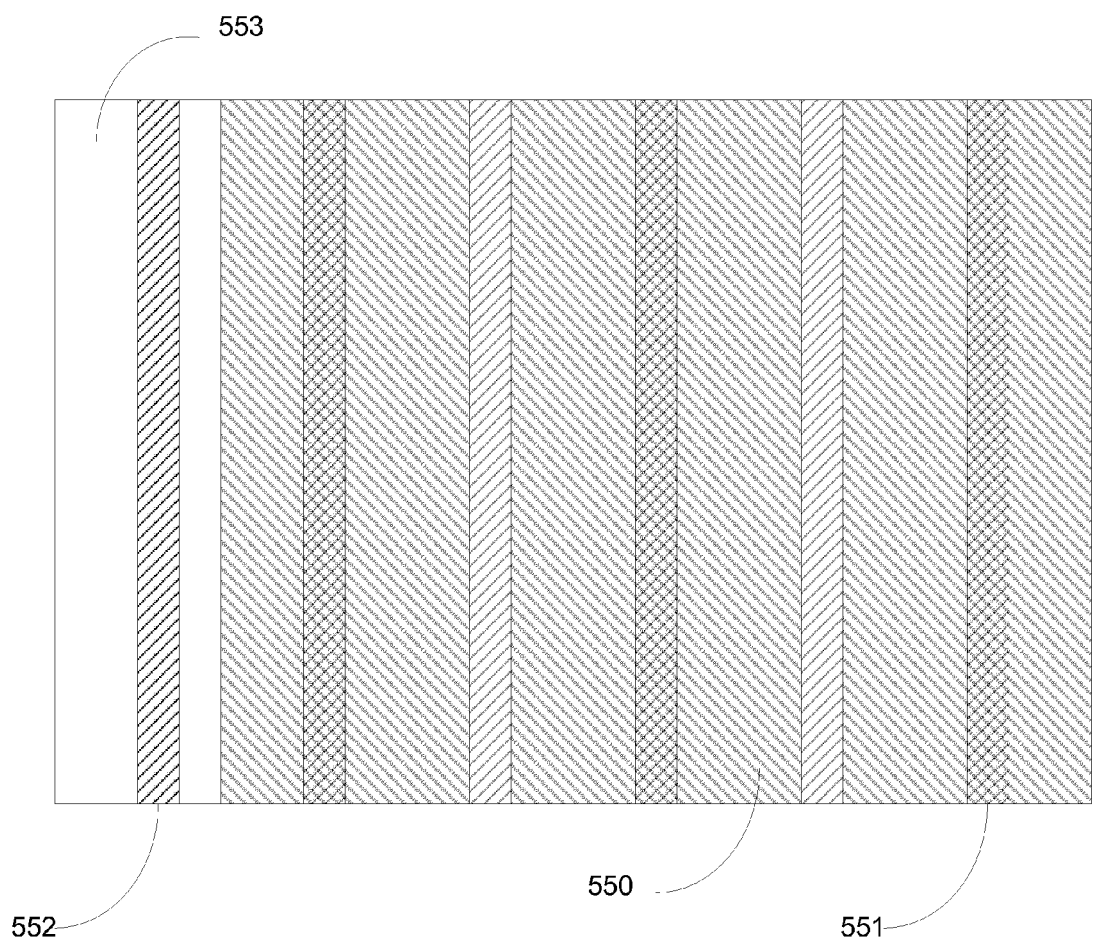
FIG. 13 shows the implant pattern on a workpiece processed according to one embodiment.

In other words, a patterned implant is performed when the mask 200 is in the path of the ion beam 10, and a plurality of implanted regions is created, each region corresponding to an aperture 201. The mask 200 and the workpiece 114 are moved relative to each other, such that the mask 200 is no longer in the path of the ion beam 10. However, the blocker 500 remains in the path of the ion beam, covering at least one of these implanted regions in each workpiece. In a further embodiment, the blocker 500 covers the area on either side of the implanted region, such that the combination of implants creates four different regions of the workpiece. FIG. 13 shows a representative workpiece after being processed according to this method. The first region 550 represents the region that was exposed only to the blanket implant. The second region 551 represents the region that was exposed to both the patterned implant and the blanket implant. The third region 552 is the region that was exposed only to the patterned implant. Finally, the fourth region 553 represents the region that is not implanted at all. This fourth region 553 was disposed behind the blocker 500 of FIG. 12.

Since the region 553 completely surrounds region 552 in FIG. 13, it is easy to discern region 552, using optical means, such as an optical scanner. The location of the region 552 can be compared to a fixed reference, such as the edge of workpiece 114 to determine if the mask 200 is properly aligned to the ion beam 10. It should be noted that this blocker 500 may be used in conjunction with the outward projections 470 described in conjunction with FIG. 10B. Note that since the workpiece is not uniformly implanted, this blocker 500 is typically only used during a first trial run, so as to confirm the alignment of the mask prior to the production of large numbers of workpieces. After alignment is confirmed, the blocker is removed so that normal processing of the workpieces may occur.

If a single mask is used, the blocker 500 may be designed to hang beneath at least one of the apertures located close to the middle of the mask, so as to prevent that portion of the workpiece from being exposed to a blanket implant.

The terms and expressions which have been employed herein are used as terms of description and not of limitation, and there is no intention in the use of such terms and expressions of excluding any equivalents of the features shown and described (or portions thereof). It is also recognized that various modifications are possible within the scope of the claims. Other modifications, variations, and alternatives are also possible. Accordingly, the foregoing description is by way of example only and is not intended as limiting.

What is claimed is:

1. A method of aligning a mask in an ion implanter comprising:
   directing an ion beam through said mask toward a workpiece, wherein said mask has a thickness and comprises at least one aperture having a width, wherein the ratio of said thickness of said mask adjacent said aperture compared to said width of said apertures is greater than 5;
   determining a location of said ion beam when it reaches the plane of said workpiece;
   adjusting an angle or position of one of said mask or said ion beam, in response to said determination.

2. The method of claim 1, wherein said determining step comprises:
   positioning a Faraday probe along said plane of said workpiece; and
   recording ion current measured by said Faraday probe.

3. The method of claim 2, further comprising
   repositioning said Faraday probe;
   repeating said recording step; and
   determining a position where a maximum ion current is recorded.

4. The method of claim 1, wherein said determining step comprises:
   positioning a workpiece on a side of said mask opposite a source of said ion beam; and
   optically determining portions of said workpiece that are implanted by said ion beam.

5. The method of claim 4, wherein said optically determining step is performed using an optical scanner.

6. The method of claim 1, wherein said a portion of said mask adjacent to said aperture is thicker than other portions of said mask.

7. The method of claim 1, wherein said ratio is greater than 10.

8. An apparatus for aligning an ion beam and masking a workpiece during ion implantation, comprising:
   a mask having a first thickness and at least one aperture, wherein said aperture comprises a width;
   projections located adjacent at least a portion of said aperture on said mask and extending in a direction parallel to a path of said ion beam,
   wherein said projections have a second thickness, such that a total thickness, defined as the sum of said first thickness and said second thickness, is at least 5 times greater than said width of said aperture.

9. The apparatus of claim 8, wherein said mask comprises a plurality of apertures, and wherein said projections are located adjacent only one of said apertures.

10. The apparatus of claim 9, wherein said plurality of apertures comprises a plurality of vertical stripes.

11. The apparatus of claim 8, wherein said mask comprises a first and second mask positioned adjacent each other, so as to create an aperture between said first mask and said second mask, and wherein a first of said projections is located on a portion of said first mask closest to said second mask, and a second of said projections is located on a portion of said second mask closest to said first mask.

12. The apparatus of claim 8, wherein said total thickness is greater than 10 times greater than said width of said aperture.

13. A method of aligning a mask and an ion beam, comprising:
   directing an ion beam through said mask toward a workpiece, said mask comprising a plurality of apertures used to implant a pattern on said workpiece, and a blocker extending from one edge of said mask;
   positioning said mask relative to said workpiece such that said apertures are in the path of said ion beam;
   implanting ions into portions of said workpiece located behind said apertures to create a plurality of implanted regions;
   moving the mask and workpiece relative to each other, such that said mask no longer blocks said path of said ion beam toward said workpiece and said blocker is in said path;
   performing an implant on said workpiece, wherein said blocker prevents implanting in a portion of said workpiece, said portion comprising at least one implanted region and an area surrounding said implanted region;
   determining a location of said at least one implanted region to as to determine the alignment; and
   adjusting an angle or position of one of said mask or said ion beam, in response to said determination.

14. The method of claim 13, further comprising:
   removing said blocker from said mask after said adjusting step; and
   processing additional workpieces.

15. The method of claim 13, wherein said mask comprises a first mask and a second mask positioned adjacent each other, wherein said blocker is attached to said mask so as to cover at least one implanted region created by said first mask and at least one implanted region created by said second mask.

16. The method of claim 15, wherein said at least one implanted region created by said first mask is one closest to said second mask; and said at least one implanted region created by said second mask is one closest to said first mask.

17. The method of claim 13, wherein said mask comprises a first and second mask positioned adjacent each other, so as to create an aperture between said first mask and said second mask, and wherein a first projection is located on a portion of said first mask closest to said second mask, and a second projection is located on a portion of said second mask closest to said first mask.

18. The method of claim 13, wherein said blocker is attached to said mask so as to cover an implanted region created by said aperture between said first mask and said second mask.

19. The method of claim 18, wherein said blocker is attached to said mask so as to cover at least one implanted region created by said first mask and at least one implanted region created by said second mask.

20. The method of claim 13, wherein said determining step is performed using an optical scanner.

* * * * *